US006493283B1

(12) United States Patent
Ford et al.

(10) Patent No.: US 6,493,283 B1
(45) Date of Patent: *Dec. 10, 2002

(54) ARCHITECTURE, METHOD (S) AND CIRCUITRY FOR LOW POWER MEMORIES

(75) Inventors: Keith A. Ford, Colorado Springs, CO (US); Iulian C. Gradinariu, Colorado Springs, CO (US); Bogdan I. Georgescu, Colorado Springs, CO (US); Sean B. Mulholland, Colorado Springs, CO (US); John J. Silver, Monument, CO (US); Danny L. Rose, Monument, CO (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/721,324

(22) Filed: Nov. 22, 2000

Related U.S. Application Data

(63) Continuation of application No. 09/398,735, filed on Sep. 17, 1999, now Pat. No. 6,163,495.

(51) Int. Cl.⁷ .................................................. G11C 8/00
(52) U.S. Cl. ................ 365/230.03; 365/63; 365/230.05
(58) Field of Search .......................... 365/230.03, 233.5, 365/63, 230.05

(56) References Cited

U.S. PATENT DOCUMENTS

| | | | |
|---|---|---|---|
| 4,982,372 A | 1/1991 | Matsuo ................... | 365/230.03 |
| 4,985,639 A | 1/1991 | Renfrow et al. ............ | 307/262 |
| 5,036,491 A | 7/1991 | Yamaguchi ............. | 365/189.07 |
| 5,060,200 A | 10/1991 | Miura et al. ........... | 365/230.05 |
| 5,119,334 A | 6/1992 | Fujii ...................... | 365/189.11 |
| 5,126,973 A | 6/1992 | Gallia et al. ................. | 365/200 |
| 5,264,745 A | 11/1993 | Woo ........................... | 935/886 |
| 5,270,975 A | 12/1993 | McAdams ................... | 365/200 |
| 5,379,257 A | 1/1995 | Matsumura et al. ... | 365/189.01 |
| 5,389,828 A | 2/1995 | Tago .......................... | 327/263 |
| 5,438,550 A | 8/1995 | Kim ........................ | 365/233.5 |
| 5,555,529 A | 9/1996 | Hose, Jr. et al. ......... | 365/230.06 |
| 5,600,274 A | 2/1997 | Houston ..................... | 327/262 |

(List continued on next page.)

OTHER PUBLICATIONS

Iulian C. Gradinariu for "Output Data Path Scheme in a Memory Device", Ser. No. 09/200,219, filed Nov. 25, 1998.
Iulian C. Gradinariu et al., for Scheme for Reducing Current in an Input Buffer, Ser. No. 09/222,578, filed Dec. 28, 1998.
Practical Digital Design Using ICs, 3rd Edition, by Joseph D. Greenfield, 1994, pp. 416–433.
Memory 1996, by Jim Griffin, Brian Matas and Christian de Subercasux, 1996, pp. 7–1 to 10–10.
Session 16:Dynamic RAMs, FAM 16.6: A 45ns 16Mb DRAM with Triple–Well Structure, By Fujii et al., IEEE International Solid–State Circuits Conference, 1989, pp. 248–249.
FA 13.5: A 15ns 16Mb CMOS SRAM with Reduced Voltage Amplitude Data Bus, By Matsumiya et al., IEEE International Solid–State Circuits Conference, 1992, pp. 214–216.

*Primary Examiner*—Richard Elms
*Assistant Examiner*—Hien Hguyen
(74) *Attorney, Agent, or Firm*—Christopher P. Maiorana, P.C.

(57) ABSTRACT

A circuit comprising a plurality of groups of memory cells and a control circuit. The plurality of groups of memory cells may each (i) have a first and a second bitline and (ii) configured to read and write data to one or more of the plurality of groups of memory cells. The control circuit may be configured to select an active group of the plurality of groups in response to one or more control signals. The control circuit may be implemented within the groups of memory cells.

20 Claims, 8 Drawing Sheets

U.S. PATENT DOCUMENTS

| | | |
|---|---|---|
| 5,691,933 A | 11/1997 | Takenaka .................... 365/63 |
| 5,696,463 A | 12/1997 | Kwon ........................ 327/172 |
| 5,828,614 A | 10/1998 | Gradinariu .................. 365/208 |
| 5,841,687 A | 11/1998 | Rees .......................... 365/63 |
| 5,872,464 A | 2/1999 | Gradinarui .................. 326/71 |
| 5,886,937 A * | 3/1999 | Jang .......................... 365/203 |
| 5,968,190 A | 10/1999 | Knaack ...................... 714/719 |
| 6,118,727 A | 9/2000 | Allan et al. ............ 365/230.06 |
| 6,163,495 A * | 12/2000 | Ford et al. ............. 365/230.03 |

\* cited by examiner

US 6,493,283 B1

ARCHITECTURE, METHOD (S) AND CIRCUITRY FOR LOW POWER MEMORIES

CROSS-REFERENCE TO RELATED APPLICATIONS

This is a continuation of U.S. Ser. No. 09/398,735 filed Sep. 17, 1999, now issued as U.S. Pat. No. 6,163,495.

The present invention may relate to co-pending applications U.S. Ser. No. 09/222,578, now issued as U.S. Pat. No. 6,323,701 and U.S. Ser. No. 09/200,219; U.S. Pat. Nos. 5,872,464 and 5,828,614, each of which is incorporated by reference in its entirety.

FIELD OF THE INVENTION

The present invention relates to memory circuits generally and, more particularly, to an architecture, method and/or circuit for implementing a low power memory.

BACKGROUND OF THE INVENTION

Conventional memory architectures includes features that waste DC and AC current consumption by one or more of the following (i) passive (no gain) static loads, (ii) large sub-wordlines, (iii) sub-wordline circuits not included in the memory array, (iv) row, column and block array partitions not included in the memory array, (v) double ended buses (address path, local and global data output path, data input path), (vi) equalization circuitry placed at one end of the memory array, (vii) address predecoders, and/or (viii) replaced defective blocks still connected to the source current.

SUMMARY OF THE INVENTION

The present invention concerns a circuit comprising a plurality of groups of memory cells and a control circuit. The plurality of groups of memory cells may each (i) have a first and a second bitline and (ii) configured to read and write data to one or more of the plurality of groups of memory cells. The control circuit may be configured to select an active group of the plurality of groups in response to one or more control signals. The control circuit may be implemented within the groups of memory cells.

The objects, features and advantages of the present invention include providing a memory that may (i) reduce and/or eliminate DC current consumption, (ii) minimize rail-to-rail switching capacitance, (iii) reduce the amount of rail-to-rail switching, and/or (iv) reduce AC current consumption,

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention is an architecture that may minimize power consumption in a memory device by eliminating or reducing the DC current consumption and reducing the AC current consumption. To eliminate the DC power consumption, the present invention may implement (i) zero stand-by current input buffers as described in application Ser. No. 09/222,578, now issued as U.S. Pat. No. 6,323,701, which is hereby incorporated by reference in its entirety, (ii) cross-coupled static bitline loads, (iii) a sense amplifier powered down by rail-to-rail excurting bitlines and/or (iv) an address skew self-timed address transition detection (ATD) path that may avoid crowbarring conditions.

To reduce the AC current consumption, the present invention may implement (i) a memory array organized in only blocks and rows (e.g., no column addresses used), (ii) single-ended buses in the periphery of the memory array and/or (iii) a single ATD equalization line that may drive equalization circuitry implemented in the middle of the memory array. The present invention may (i) eliminate predecoders in the address path, (ii) implement, in one example, only 16 cells per block that may be activated during access to the memory array, (iii) local amplifiers (e.g., one per bitline pair) that may drive single-ended local Q-buses, (iv) global to local output feedback for the unaccessed blocks and/or (v) blocks that may be powered down when defective and/or (vi) redundant blocks powered down when not in use.

Figure 1:
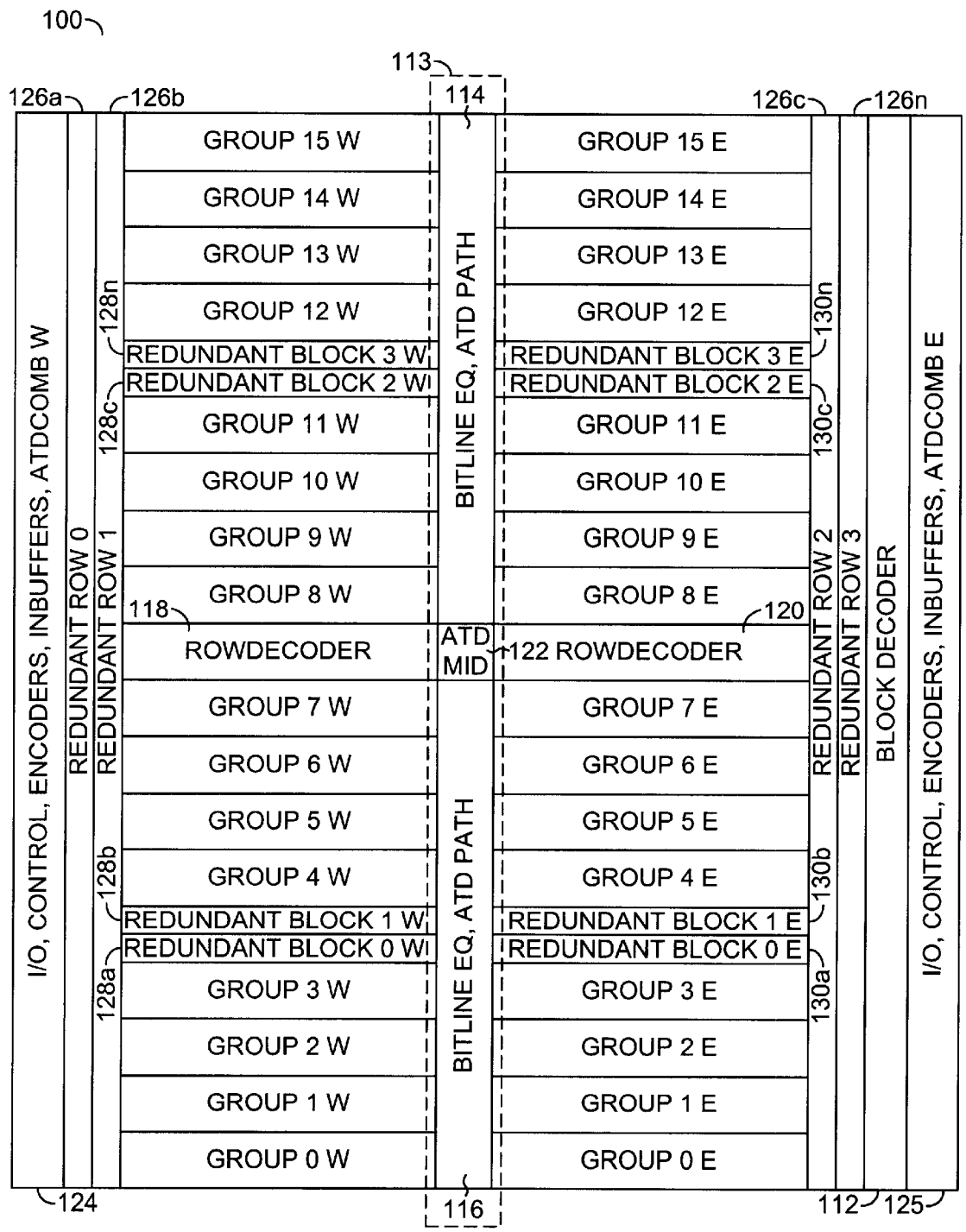
FIG. 1 is a block diagram of a preferred embodiment of the present invention.

Referring to FIG. 1, a block diagram of a circuit 100 is shown in accordance with a preferred embodiment of the invention. The circuit 100 may comprise a first number of groups (e.g., GROUP 0W–15W), a second number of groups (e.g., GROUP 0E–15E) and a control circuit 113. The control circuit 113 may be implemented, in one example, as an address skew self-timed address transition detection (ATD) path (to be described in detail in connection with FIGS. 8(a)–8(b), FIG. 9 and FIG. 10). The circuit 100 may further comprise a block decoder 112, a row decoder 118, a row decoder 120, an I/O control block (or circuit) 124 and an I/O control block (or circuit) 125. The ATD path 113 may comprise a bitline equalization block (or circuit) 114, a bitline equalization block (or circuit) 116 and an address transition detection combination ATDMID circuit 122. The I/O control circuits 124 and 125 may comprise various circuits such as encoders, input buffers, address transition detection combination circuits, etc., to meet the criteria of a particular implementation.

The row decoder 118 and the row decoder 120 are shown implemented between the GROUP 7W and the GROUP 8W, and the GROUP 7E and the GROUP 8E, respectively. The address transition detection combination circuit 122 (to be described in more detail in connection with FIG. 7) is shown implemented between the row decoder 118 and the row decoder 120. The bitline equalization circuits 114 and 116 are shown implemented above and below the address transition detection circuit decoder 122. The address transition detection circuit decoder 122 may control the bitline equalization circuits 114 and 116 using a single address transition signal (e.g., ATDG to be described in detail in conjunction with FIG. 10). The uniqueness of the bitline equalization circuits 114 and 116 may minimize rail-to-rail switching within the circuit 100.

The circuit 100 may also comprise a number of redundant rows 126a–126n, a first plurality of redundant blocks 128a–128n and a second plurality of redundant blocks 130a–130n. The redundant blocks 128a–128n and 130a–130n may be implemented to replace a defective block within the circuit 100. The defective block may be electrically disconnected with one or more fuses (not shown) or other non-fuse alternative (for example, U.S. Ser. No. 08/741,953, now issued as U.S. Pat. No. 5,968,190, which is hereby incorporated by reference in its entirety). The redundant blocks 128a–128n and 130a–130n may only be activated when accessed in order to conserve power. A block power supply (e.g., Vccx) of the defective block may be disconnected from the supply voltage Vcc to eliminate additional current consumption in a stand-by mode. The replacement of the defective block may ensure the functionality of the circuit 100.

Figure 2:
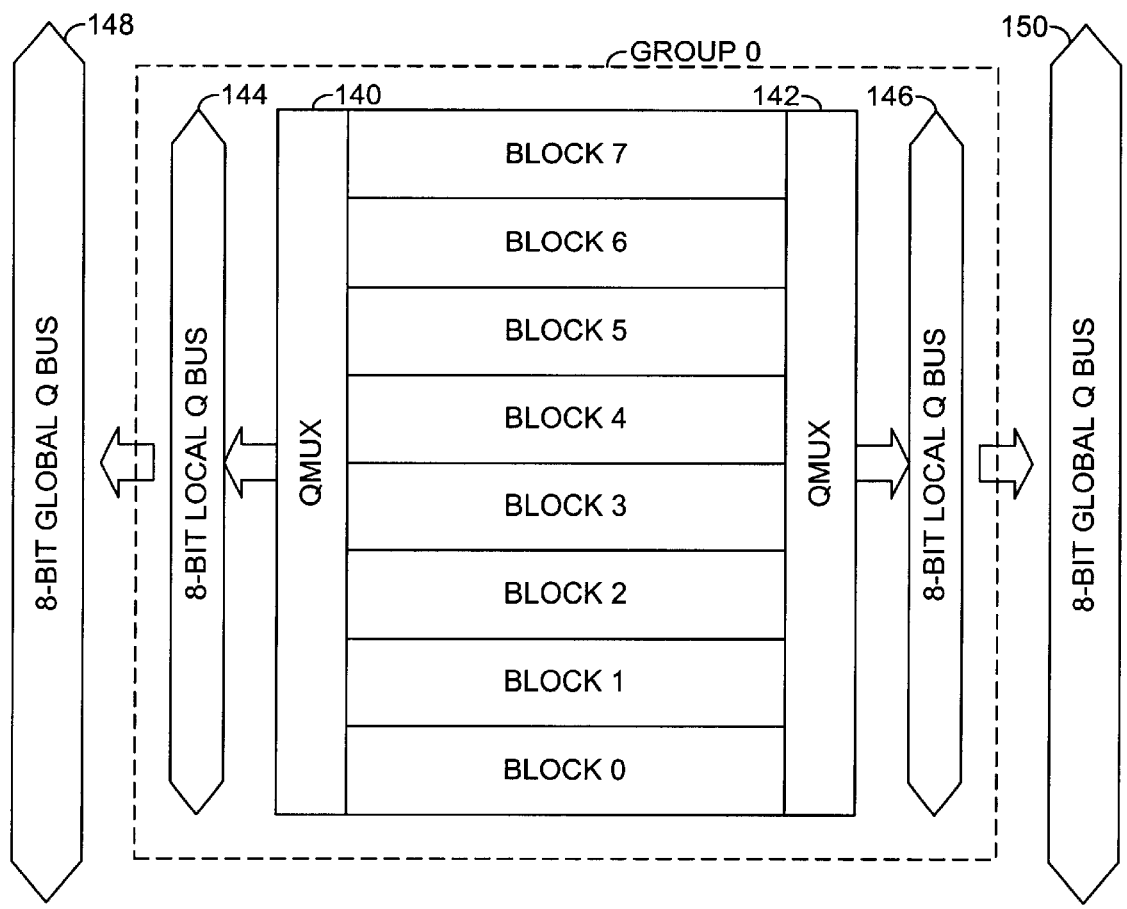
FIG. 2 is a block diagram of a group of the circuit of FIG. 1.

Referring to FIG. 2, a block diagram of an exemplary block (e.g., GROUP0) is shown. Each of the first and second number of groups GROUP0–15 and may have similar components and/or function as the GROUP0 described in connection with FIG. 2. The GROUP0 may comprise an output data multiplexer 140, an output data multiplexer 142, a local bus 144 and a local bus 146. The GROUP0 may communicate to other devices (not shown) through a global bus 148 and a global bus 150. The bus 144 and the bus 146 may be implemented as single-ended local Q buses or other bus types in order to meet the criteria of a particular implementation. Additionally, the global buses 148 and 150 may be implemented as single-ended global Q buses or other bus types in order to meet the criteria of a particular implementation.

The GROUP 0 is shown implementing a number of blocks (e.g., BLOCK0–BLOCK7). While eight blocks are shown, the particular number of blocks may be adjusted accordingly to meet the design criteria of a particular implementation. The output data multiplexers 140 and 142 may multiplex data from the single-ended local Q bus to the single-ended global Q buses 148 and 150. The data is generally fed back through the single-ended global Q buses 148 and 150 to the other local buses of unaccessed blocks (not shown). The feedback of the data may help to avoid glitching of the data output path while selecting a new GROUP, as described in the referenced co-pending application.

Figure 3:
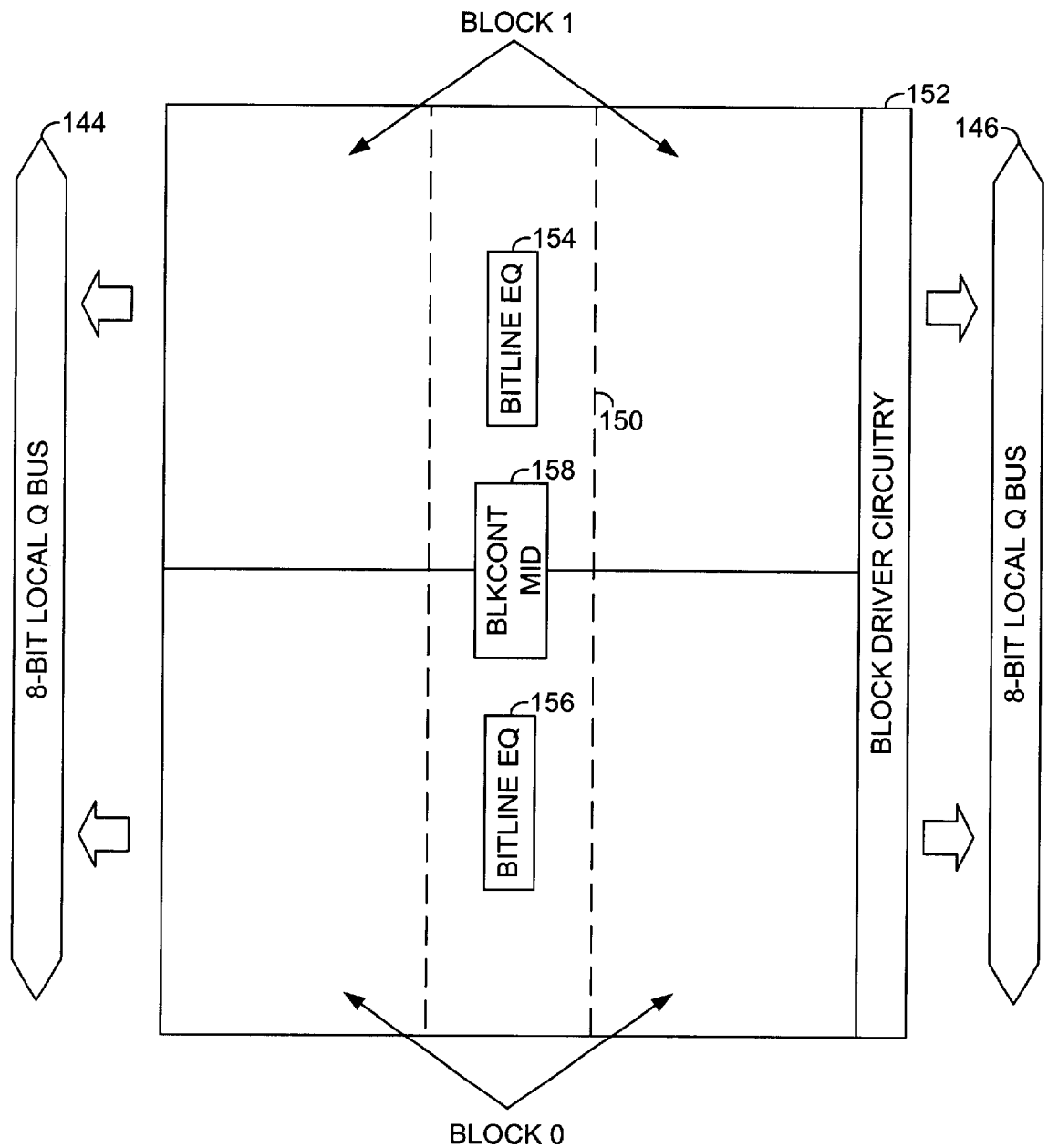
FIG. 3 is a block diagram of a block configuration of the circuit of FIG. 2.

Referring to FIG. 3 a block diagram of the BLOCK0 and BLOCK1 of FIG. 2 is shown. The BLOCK0 and the BLOCK1 generally comprise a bitline equalization path 150 and a driver block (or circuit) 152. The BLOCK0 and BLOCK1 may communicate through the single-ended Q logic bus 144. The Q logic bus may be common to, in one example, a group of 8 blocks. Additionally, the BLOCK0 and BLOCK1 may communicate through the single ended Q logic bus 146. The driver circuit 152 may select the active block.

The bitline equalization path 150 may comprise a bitline equalization block (or circuit) 154, a bitline equalization block (or circuit) 156 and a control block (or circuit) 158. The BLOCK0 and the BLOCK1 may each be interdigitated (e.g., able to be alternatively accessed from two sides) with respect to the bus 144 and the bus 146.

The blocks BLOCK0 and BLOCK1 are generally organized in a row fashion, without the implementation of column circuitry (e.g., column decoders, etc.). Since the bitline equalization circuits 154 and 156 are implemented within the blocks BLOCK0 and BLOCK1, respectively (as compared with conventional equalization circuits that are implemented in the periphery), a reduction in power may be achieved.

Figure 4:
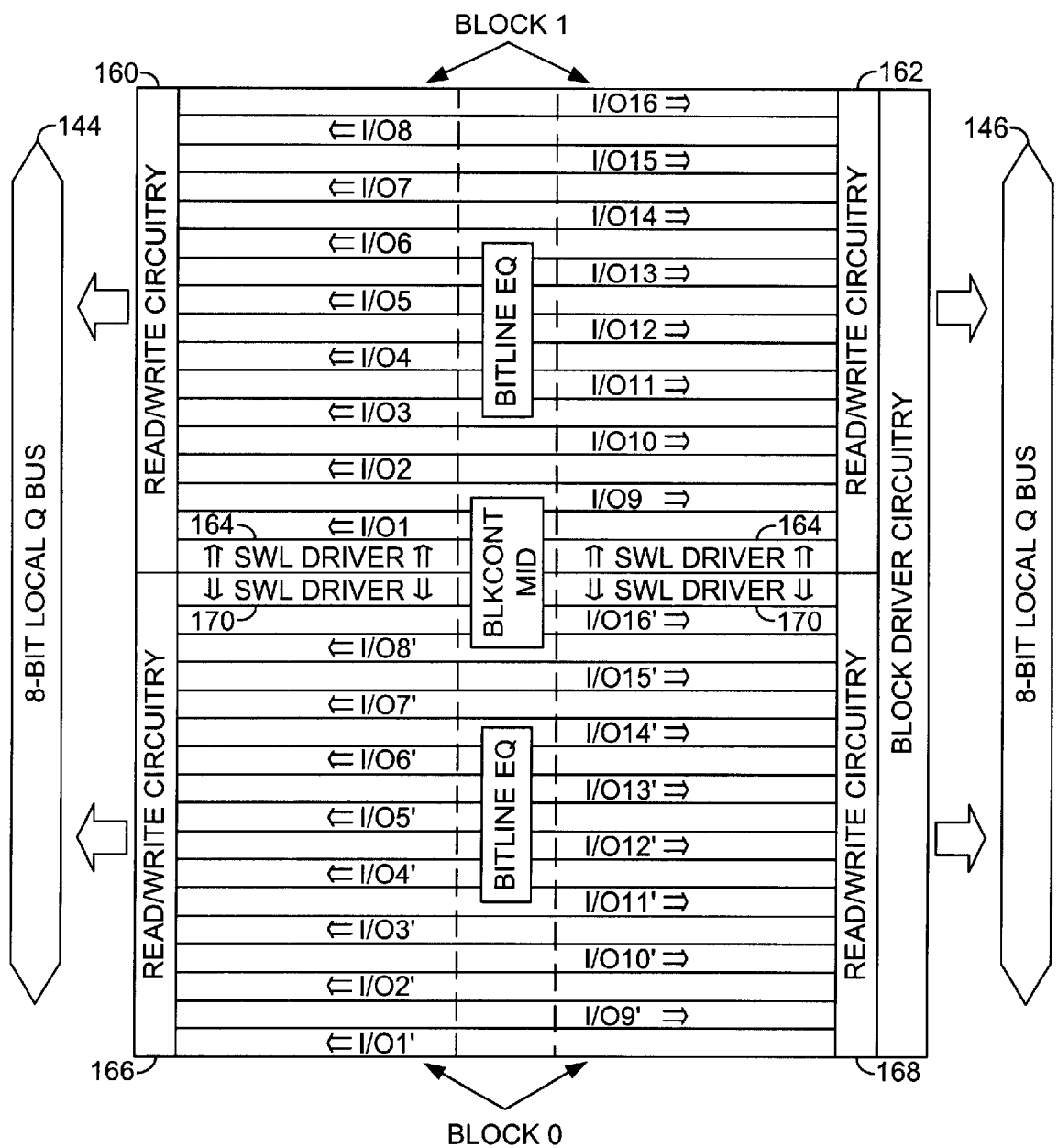
FIG. 4 is a more detailed block diagram of a block configuration of the circuit of FIG. 3.

Referring to FIG. 4, a circuit diagram of the blocks BLOCK0 and BLOCK1 of FIG. 3 is shown. The block BLOCK0 generally comprises a first number of cell columns (e.g., I/O1'–I/)16'), a bitline equalization circuit 156, a read/write block (or circuit) 166, a read/write block (or circuit) 168 and a driver 170. The block BLOCK1 generally comprises a second number of cell columns (e.g., I/01–I/016), a read/write block (or circuit) 160, a read/write block (or circuit) 162 and a driver 164. The driver 164 and the driver 170 may be implemented as a sub-wordline drivers or other driver types in order to meet the criteria of a particular implementation. A local sense amplifier (not shown) may be implemented in each block of first and second number of groups GROUP0W–15W and GROUP0E–15E. Furthermore, the local sense amplifiers may be implemented for each cell column (bitlines pair) of each block. The local sense amplifiers may drive the single-ended local Q buses 144 and 146.

The blocks BLOCK0 and BLOCK1 are generally connected to the read/write circuits 160, 162, 166 and 168 through a number of bitlines. The wordlines are generally implemented as short sub-wordlines (e.g., a wordline connected to a limited number of memory cells). The blocks BLOCK0 and BLOCK1 may each be interdigitated (e.g., able to be alternatively accessed from both sides) with respect to the bus 144 and the bus 146. A small number of cells being selected within each block BLOCK0–7 of the first and second number of groups GROUP0W–15W and GROUP0E–15E may further reduce power consumption.

Figure 5:
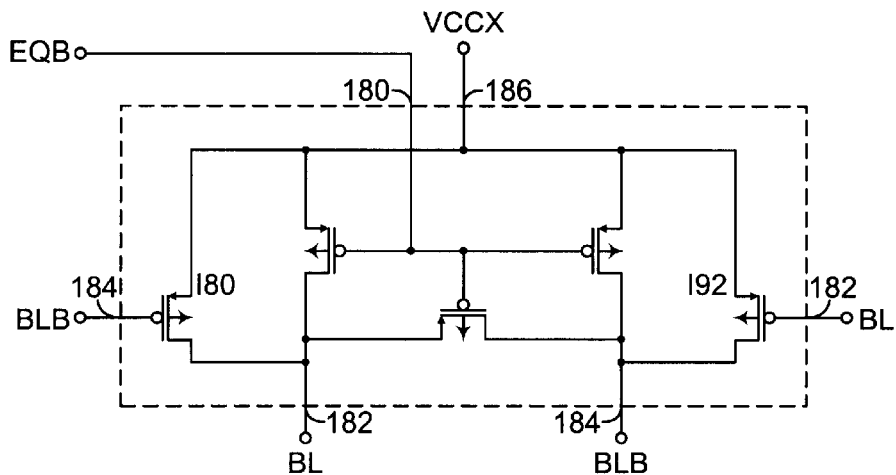
FIG. 5 is a diagram of a bitline equalization circuit of FIG. 1.

Referring to FIG. 5, an example of a bitline equalization circuit 114 is shown. The bitline equalization circuit 116 may be similar to the bitline equalization circuit 114. The bitline equalization circuit 114 is generally implemented between a bitline (e.g., BL) and a bitline bar (e.g., BLB). The equalization circuit 114 may be implemented with cross-coupled static bitline loads. The transistors 192 and 180 are generally cross-coupled to eliminate (or reduce) current consumption.

The bitline equalization circuit 114 generally receives an equalization signal (e.g., EQB) at an input 180, the bitline BL at an input 182, the bitline bar BLB at an input 184 and a block current voltage (e.g., Vccx) at an input 186. The signal EQB may be an address transition detection signal (e.g., ATDBG) and/or a block enable signal (e.g., BLKSA) (not shown). The bitline equalization circuit 114 may present an equalized bitline (e.g., BL) at an output 182. The bitline equalization circuit 114 may present an equalized bitline bar (e.g., BLB) at an output 184. The bitline equalization circuit may present the equalized bitlines BL and BLB in response to the bitline BL, the bitline bar BLB, the signal EQB and the source block voltage Vccx.

Reading and writing of data by the circuit 100 may be accomplished according to the signal EQB. The signal EQB may cause the bitline equalization circuits 114 and 116 to equalize the bitline BL and the bitline bar BLB during a pulse of a predetermined length (e.g., p). The length of pulse p, may be determined by the signal EQB. Once the bitline BL and the bitline bar BLB are equalized, the equalized bitline BL and the equalized bitline bar BLB may connect to the memory cells of the addressed block from BLOCK0–BLOCK7 of the first and second number of groups GROUP0W–15W and GROUP0E–15E. The bitline BL and bitline bar BLB may read and/or write. The bitline BL and the bitline bar BLB may be equalized to the block voltage Vccx after each address and/or data transition and at the end of each write cycle. After the read and/or write the bitline BL and bitline bar BLB are generally fully excurted. The excurted bitline BL and the excurted bitline bar BLB generally do not draw any further current. Additionally, the signal EQB generally is valid only in the active blocks within the first and second number of groups GROUP0W–15W and GROUP0E–15E, which may save current.

Figure 6:
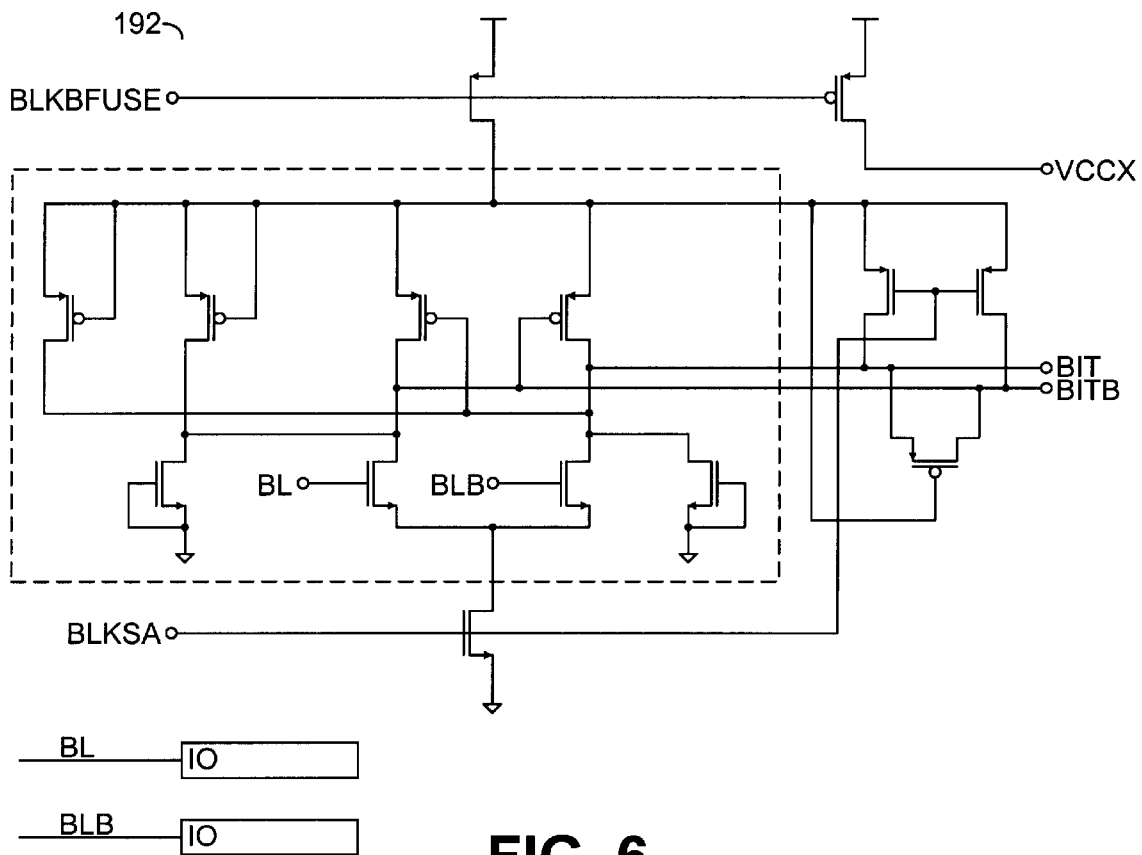
FIG. 6 is a diagram of a sense amplifier that may be used with the present invention.

Referring to FIG. 6, an example of a sense amplifier 192 that may be implemented with the present invention is shown. The sense amplifier 192 may power up the block in response to a signal (e.g., BLKBFUSE). The sense amplifier 192 may further power up the redundant blocks 128a–128n and 130a–130n when accessed. The sense amplifier 192 may be implemented, in one example, for every cell column of the circuit 100 (e.g., in every bitline pair, the bitline BL and the bitline bar BLB).

Figure 7:
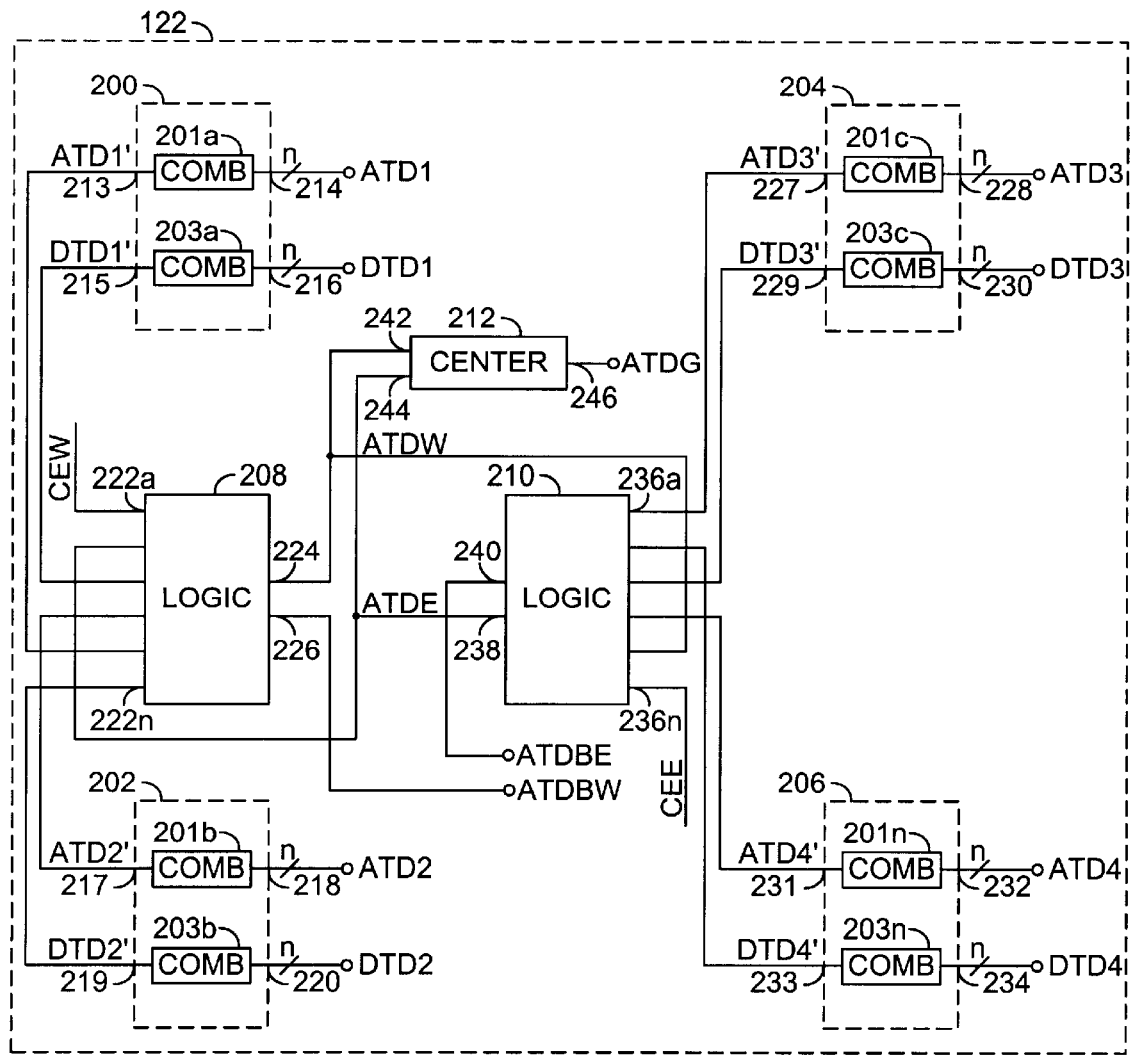
FIG. 7 is a detailed block diagram of an address transition detection combination circuit of FIG. 1.

Referring to FIG. 7, an example of an address transition detection (ATD) path circuit 122 is shown. The address transition circuit 122 generally comprise a logic block (or circuit) 200, a logic block (or circuit) 202, a logic block (or circuit) 204, a logic block (or circuit) 206, a logic block (or circuit) 208, a logic block (or circuit) 210 and a center logic block (or circuit) 212. The logic block s (or circuits) 200, 202, 204 and 206 may be implemented with gates (see FIGS. 8a and 8b) or any other type of circuits in order to meet the criteria of a particular implementation. Each logic block (or circuit) 200, 202, 204 and 206 may comprise a combination block (or circuit) 201a–201n and a combination block (or circuit) 203a–203n. The combination circuits 201a–201n and 203a–203n may be implemented as atdcomb circuits, dtdcomb circuits, or any other type of circuit in order to meet the criteria of a particular implementation.

The logic block 200 may present a signal (e.g., ATD1') at an output 213 and a signal (e.g., DTD1') at an output 215. The atdcomb circuit 201a may present the signal ATD1' in response to a plurality of signals (e.g., ADDRESS TRANSITION DETECT) received at an input 214 of the circuit 200. The dtdcomb circuit 203 may present the signal DTD1' in response to a plurality of signals (e.g., DTD1) received at an input 216.

The circuit 202 may present a signal (e.g., ATD2') at an output 217 and a signal (e.g., DTD2') at an output 219. The atdcomb circuit 201b may present the signal ATD2' in response to one or more signals (e.g., ATD2) received at an input 218 of the circuit 202. The dtdcomb 203b may present the signal DTD2' in response to a plurality of signals (e.g., DTD2) received at an input 220 of the circuit 202.

The signal ATD1', the signal DTD1', the signal ATD2', the signal DTD2', a control signal (e.g., CEW) and a signal (e.g., ATDE) may be presented to the logic circuit 208 at a number of inputs 222a–222n. The logic circuit 208 may be implemented as a west control logic circuit (e.g., a circuit that may control the west most blocks) or other type of logic circuit in order to meet the criteria of a particular implementation. The west control logic circuit 208 may present a signal (e.g., ATDW) at an output 224 and a signal (e.g., ATDBW) at an output 226.

The circuit 204 may present a signal (e.g., ATD3') at an output 227 and a signal (e.g., DTD3') at an output 229. The atdcomb circuit 201c may present the signal ATD3' in response to one or more signals (e.g., ATD3) received at an input 228 of the circuit 204. The dtdcomb circuit 203c may present the signal DTD3' in response to one or more signals (e.g., DTD3) received at an input 230 of the circuit 204.

The circuit 206 may present a signal (e.g., ATD4') at an output 231 and a signal (e.g., DTD4') at an output 233. The atdcomb circuit 201n may present the signal ATD4' in response to one or more signals (e.g., ATD4) received at an input 232 of the circuit 206. The dtdcomb circuit 203n may present the signal DTD4' in response to a plurality of signals (e.g., DTD4) received at an input 234 of the circuit 206. The signals ATD1–ATD4 and the signals DTD1–DTD4 are generally generated by rail-to-rail switching of address or data inputs in the circuit 100.

The signal ATD3', the signal DTD3', the signal ATD4', the signal DTD4', a control signal (e.g., CEE) and the signal ATDW may be presented to the logic circuit 210 at a number of inputs 236a–236n. The logic circuit 210 may be implemented as a east control logic circuit (e.g., a logic circuit that may control the east most blocks) or other type of logic circuit in order to meet the criteria of a particular implementation. The east control logic circuit 210 may present the signal ATDE at an output 238 and a signal (e.g., ATDBE) at an output 240.

The signal ATDW and the signal ATDE may be presented to the center logic circuit 212 at an input 242 and 244, respectively. The center logic circuit 212 may present the signal ATDG at an output 246 in response to the signal ATDW and the signal ATDE. The signal ATDG may drive the bitline equalization circuits 114 and 116 (shown in FIG. 1). By using a single signal ATDG, the circuit 100 may save current by minimizing the number of bitlines that may switch rail-to-rail. The signal ATDBW and the signal ATDBE may be used in conjunction with the signal BLKSA in order to generate the equalization signal EQB.

Figure 8A:
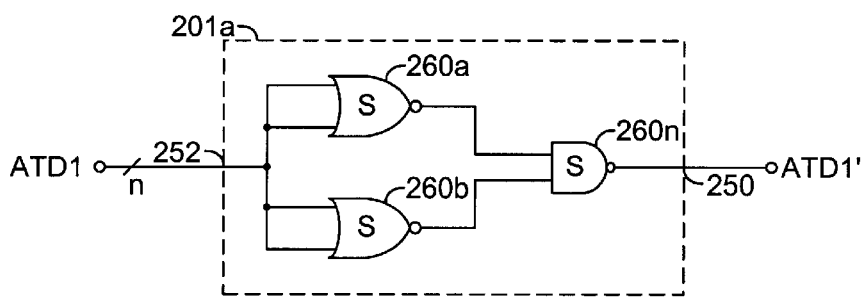
FIGS. 8(a)–8(b) are detailed circuit diagrams of the circuit of FIG. 7.
Figure 8B:
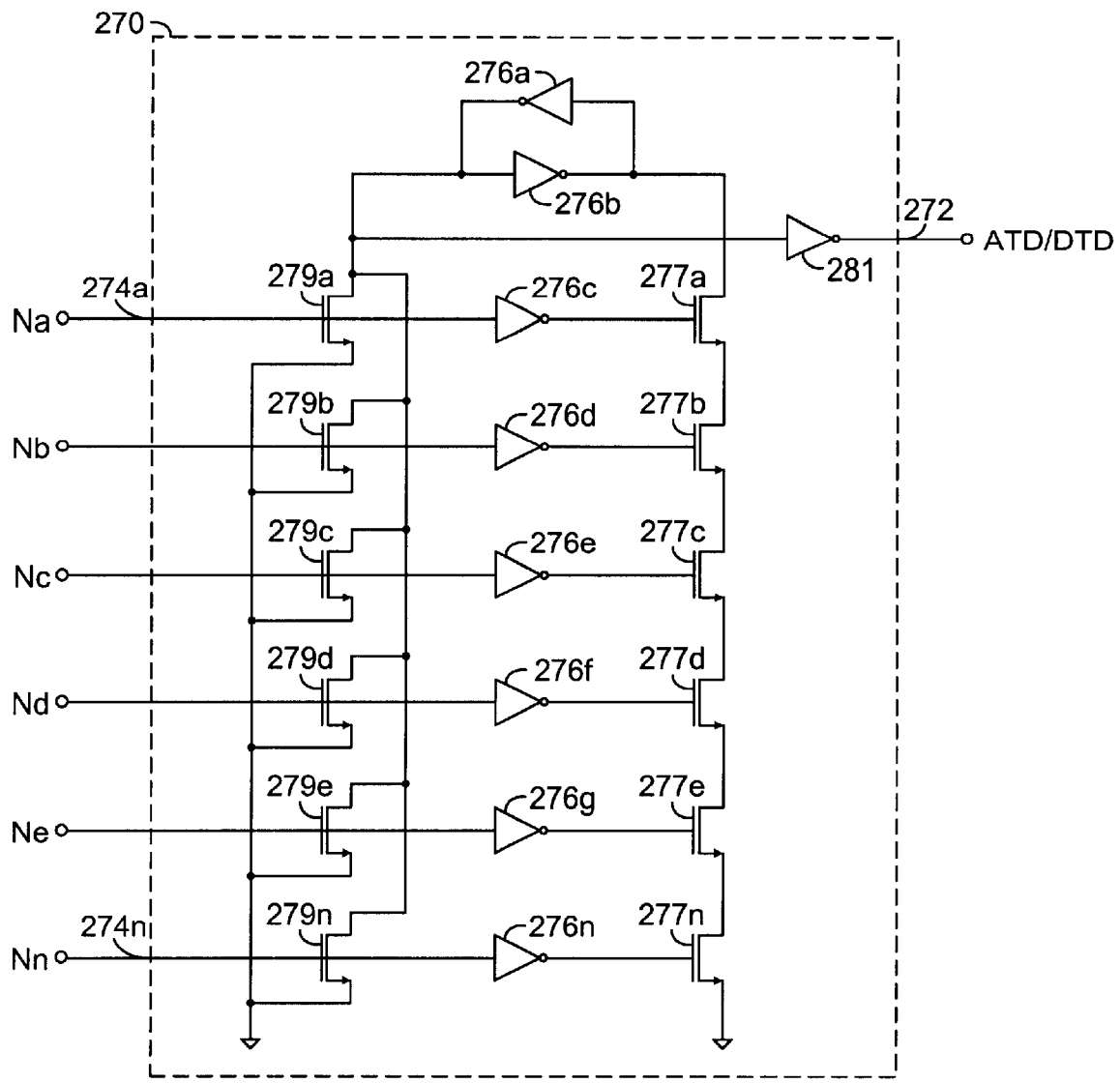

Referring to FIGS. 8(a)–8(b), examples of circuits that may be used to implement the atdcomb circuits 201a–201n and/or dtdcomb circuits 203a–203n of FIG. 7 are shown. In one example, the circuit of FIG. 8(a) may be the atdcomb circuit 201a. The atdcomb circuit 201a may present the signal ATD1' at an output 250 in response to the plurality of signals ADDRESS TRANSITION DETECT received at an input 252. The atdcomb circuit 201a may comprise a number of gates 260a–260n. The gates 260a–260n may be connected between the input 252 and the output 250. The gates 260a–260n may be implemented, in one example, as NOR gates and NAND gates. However, other type of gate configurations may be implemented in order to meet the criteria of a particular implementation. The implementation of the logic gates 260a–260n within the atdcomb circuits 201a–201n and the dtdcombs 203a–203n may prevent crowbar conditions in the circuit 100.

The circuit of FIG. 8(b) shows a supplementary atd/dtdcomb circuit 270. The atd/dtdcomb circuit 270 may present a signal (e.g., ATD/DTD) at an output 272. The atd/dtdcomb circuit 270 may present the signal ATD/DTD in response to a number of signal (e.g., Na–Nn) received at a number of inputs 274a–274n. The atd/dtdcomb circuit 270 may comprise a number of inverters 276a–276n. The inverters 276c–276n may be connected between the inputs 274a–274n and a number of transistors 277a–277n. The source and drain connections of transistors 277a–277n may be serially connected between the inverters 276a–276b and ground. A number of transistors 279a–279n may also be connected between the inverters 276a–276b and ground.

The drain terminals of the transistors 279a–279n may be coupled together. The source terminals of the transistors 279a–279n may be coupled to ground. The drain terminal of the transistor 279a may present the signal ATD/DTD at the output 272, through an inverter 281. The atd/dtdcomb circuit 270 may be allow for a larger number of input signals than the atdcomb circuit 201a of FIG. 8(a).

Figure 9:
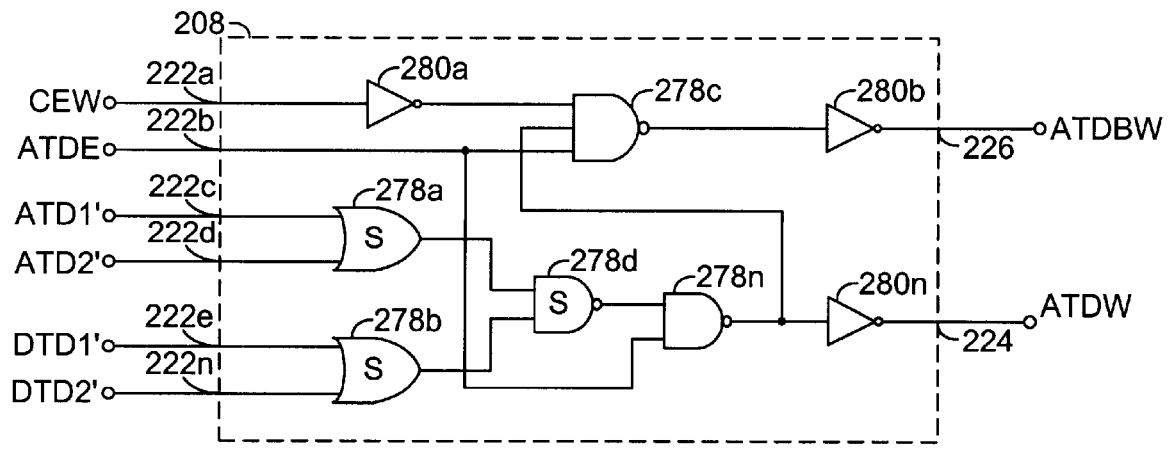
FIG. 9 is a detailed circuit diagram of a control circuit of FIG. 7.

Referring to FIG. 9 a circuit diagram of the west control logic circuit of FIG. 7 is shown. The west control logic circuit may present the signal ADTW at the output 224 and the signal ATDBW at the output 226. The west control logic circuit 208 may present the signal ATDW and the signal ATDBW in response to a number of signals received at the inputs 222a–222n. The west control logic circuit 208 may receive the control signal CEW at the input 222a, the signal ATDE at the input 222b, the signal ATD1' at the input 222c, the signal ATD2' at the input 222d, the signal DTD1 at the input 222e and the signal DTD2' at the input 222n.

The west control logic circuit 208 may comprise a number of gates 278a–278n and a number of inverters 280a–280n. The gates 278a–278n and the inverters 280a–280n may be coupled between the inputs 222a–222n and the outputs 224 and 226. The east control logic 210 may be similar to the west control logic circuit 208. The east control logic circuit 210 may present the signal ADTE at the output 238 and the signal ATDBE at the output 240. The east control logic circuit 210 may present the signal ATDE and the signal ATDBE in response to a number of signals received at the inputs 236a–236n. The east control logic circuit 210 may receive the control signal CEE at the input 236a, the signal ATDW at the input 236b, the signal ATD3' at the input 236c, the signal ATD4' at the input 236d, the signal DTD3' at the input 236e and the signal DTD4' at the input 236n.

Figure 10:
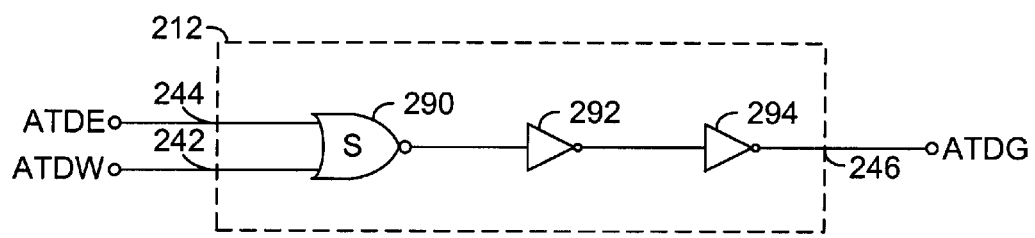
FIG. 10 is a detailed circuit diagram of another control circuit of FIG. 7.

Referring to FIG. 10 a circuit diagram of the center logic circuit 212 of FIG. 7 is shown. The center logic circuit 212 may present the signal ATDG at the output 246 in response to the signal ATDW received at the input 242 and the signal ATDE received at the input 244. The center logic circuit 212 may comprise a gate 290, an inverter 292 and an inverter 294. The gate 290 may be implemented, in one example, as a NOR gate. However, other types of logic gates may be implemented in order to meet the criteria of a particular implementation. The gate 290 may receive the signal ATDE at an input P and the signal ATDW at an input N. The inverters 292 and 294 may be connected between the gate 290 and the output 246. The implementation of the logic gates within the ATD path may prevent crowbar conditions in the circuit 100 that may minimize DC current consumption.

The proposed architecture minimizes the DC and the AC power used in the circuit 100. The circuit 100 may maximize the advantages of two different approaches. The first approach may minimize or eliminate the DC current consumption. The second approach may minimize the AC current consumption. To achieve a minimal DC consumption, a variety of new circuits were implemented. To reduce the AC current consumption, the total capacitance switching rail-to-rail is generally minimized. Additionally, avoiding unnecessary switching may also reduce AC current consumption.

In one example, the circuit 100 may implemented as a 2-Meg memory. The 2-Meg memory 100 may have a single ATD equalization signal ATDG that may control the bitline equalization circuits 114 and 116. However, in another example, the circuit 100 may be implemented as a 4-Meg memory. The 4-Meg memory 100 may implement two ATD equalization signals situated at ⅓ and ⅔ of the array. The two ATD equalization signals may be implemented due to increased length of the bitlines (which are two times longer). Additional size memory devices may also be implemented with similar numbers of ATD circuits.

The circuit 100 may consume essentially zero DC current by implementing (i) the zero stand-by current input buffers, (ii) the cross-coupled static bitline loads BL and BLB, (iii) the sense amplifiers powered down by rail-to-rail excurting bitlines BL and BLB, and/or (iv) the gate-based address skew self-timed ATD path 113 that may avoid crowbarring conditions.

The circuit 100 may minimize AC current by (i) organizing the first and second number of groups GROUP0W–15W and GROUP0E–15E in only blocks and rows, with no column address being used (as shown in FIG. 1), (ii) eliminating column address lines and circuitry for turn-on/equalization of the unaccessed columns and/or (iii) minimizing the number of cells active at a given time, for example, to 16 cells per block.

The following TABLE 1 illustrates the maximum average operating current consumption that the present invention may provide in a 2 Meg SRAM implementation compared with a conventional implementation:

TABLE 1

| Circuit | Icc (mA) Regular SRAM | Icc (mA) Low Power SRAM | Observations |
|---|---|---|---|
| Row path | 4.14 | 1.61 | AC: single ended busses DC: zero stand-by current input buffers |
| Block path | 2.86 | 0.77 | AC: single ended busses, only 16 cells per block active at a time DC: zero stand-by current input buffers |
| Col path | 3.08 | N/A | no columns used (no column address lines, no circuits of turn-on/equalization of the unaccessed columns) |
| Address Total | 10.08 | 2.38 | AC: no predecoders, single ended busses, only 16 cells per block active at a time DC: zero stand-by current input buffers, address skew self-timed ATD path, single ATD line placed in the middle of the array |
| Bitlines | 16.17 | 0.94 | AC: only 16 cells active at a time DC: cross-coupled static bitline loads |
| Senseamps | 12.17 | 0.91 | DC: sense amplifier powered down by rail-to-rail excurting bitlines |
| Q path | 19.51 | 0.61 | In regular SRAM, DC consumption during write + differential lines In Low Power: single-ended Q lines, global Q data is fed back to local Q lines on all deselected groups |
| ICC total | 62.81 | 9.43 | |

The cell-like subword line drivers 164 and 166 may be implemented inside the first and second number of groups GROUP0W–15W and GROUP0E–15E, respectively. A sub-wordline driver may be implemented for each row in each block BLOCK0–7 of the first and second number of groups GROUP0W–15W and GROUP0E–15E. The single-ended buses 144, 146, 148 and 150 are generally used in the periphery for the block address path, the local and global data output paths and the data input path. Sense amplifiers 192 of FIG. 6 followed by a driver/circuit (now shown) may drive a single-ended local Q-bus 144 and/or 146. Data on the global Q data bus 148 and/or 150 may be fed back to the local Q buses on all deselected groups that may avoid glitching of the data output path while selecting a new group of the first and second number of groups GROUP0W–15W and/or GROUP0E–15E. The signal ATDG, which drives the equalization circuitry 114 and 116, may be generated by circuitry placed in the middle of the circuit 100. The block current Vccx may be disconnected from the supply voltage Vcc to eliminate the defective block contribution to current consumption in stand-by mode.

The present invention may be particularly applicable to battery-operated devices, such as cellular phones, pagers, notebooks/palmtop computers, etc.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   a plurality of groups of memory cells each (i) having a first and a second bitline and (ii) configured to read and write data to one or more of said plurality of groups of memory cells; and
   a control circuit configured to select an active group of said plurality of groups in response to one or more control signals, wherein said control circuit is implemented within said groups of memory cells.

2. The circuit according to claim 1, wherein each of said plurality of groups of memory cells is interdigitated.

3. The circuit according to claim 2, wherein each of said groups of memory cells comprises a plurality of blocks.

4. The circuit according to claim 3, wherein each of said plurality of blocks comprises a plurality of short sub-wordlines.

5. The circuit according to claim 4, wherein each of said cells in said active group are active when said short sub-wordlines are active, without column addresses.

6. The circuit according to claim 1, wherein said control circuit further comprises a single self-timed address transition detection circuit configured to decode said data to be read or written.

7. The circuit according to claim 3, wherein each block of said plurality of blocks comprises a sub-wordline driver for each row.

8. The circuit according to claim 1, wherein said first and second bitline have cross-coupled loads.

9. The circuit according to claim 1, further comprising one or more local buses and one or more global buses, wherein (i) each of said local buses comprises one or more single-ended local Q buses and (ii) each of said global buses comprises one or more single-ended global Q buses.

10. The circuit according to claim 9, wherein said one or more global data buses are configured to feed back data to said one or more local buses of said groups that are deselected.

11. The circuit according to claim 3, wherein each block of said plurality of blocks comprises a plurality of said memory cells.

12. The circuit according to claim 9, where each of said first and second bitline pair comprises a sense amplifier, wherein said each sense amplifier is configured to drive said one or more local buses.

13. The circuit according to claim 12, wherein said each sense amplifier is powered down by rail-to-rail excurting of said first and second bitline pair.

14. The circuit according to claim 3, wherein said control circuit is further configured to disconnect a defective block from a block power supply.

15. The circuit according to claim 14, wherein said control circuit is further configured to replace said defective block with one or more redundant blocks that are active only when enabled.

16. The circuit according to claim 1, wherein said plurality of groups are organized in rows and blocks.

17. A circuit comprising:
   means for reading and writing to and from a plurality of groups of bitlines; and
   means for selecting an active group within said plurality of groups in response to a single address detection signal and one or more control signals.

18. A method for reading and writing data to a plurality of memory cells comprising the steps of:
   (A) reading and writing to and/or from a selected group of a plurality of groups of said memory cells using a first and a second bitline; and
   (B) selecting said active group of said plurality of groups in response to a single address transition detection signal and one or more control signals.

19. The method according to claim 18, wherein (i) each group is organized in a plurality of rows and a plurality of blocks and (ii) each block of said plurality of blocks comprises a sub wordline driver for each row.

20. The method according to claim 19 further comprising the step of:
   (C) disconnecting a defective block of said plurality of blocks from a block power supply and replacing the defective block with a redundant block.

* * * * *